(12) United States Patent
Dusanapudi et al.

(10) Patent No.: US 11,094,391 B2
(45) Date of Patent: Aug. 17, 2021

(54) LIST INSERTION IN TEST SEGMENTS WITH NON-NATURALLY ALIGNED DATA BOUNDARIES

(71) Applicant: International Business Machines Corporation, Armonk, NY (US)

(72) Inventors: Manoj Dusanapudi, Bangalore (IN); Shakti Kapoor, Austin, TX (US); Nelson Wu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 16/433,142

(22) Filed: Jun. 6, 2019

(65) Prior Publication Data
US 2019/0287639 A1    Sep. 19, 2019

Related U.S. Application Data

(62) Division of application No. 15/850,201, filed on Dec. 21, 2017, now Pat. No. 10,438,682.

(51) Int. Cl.
| | | |
|---|---|---|
| *G11C 29/00* | (2006.01) | |
| *G11C 29/38* | (2006.01) | |
| *G11C 29/36* | (2006.01) | |
| *G11C 29/50* | (2006.01) | |
| *G11C 29/44* | (2006.01) | |
| *G11C 29/06* | (2006.01) | |

(52) U.S. Cl.
CPC ............. *G11C 29/38* (2013.01); *G11C 29/36* (2013.01); *G11C 29/50* (2013.01); *G11C 29/06* (2013.01); *G11C 2029/4402* (2013.01)

(58) Field of Classification Search
CPC .............. G11C 29/50; G01R 31/31835; G01R 31/31715; G01R 31/318328
See application file for complete search history.

(56) References Cited

U.S. PATENT DOCUMENTS

| | | | | |
|---|---|---|---|---|
| 5,165,029 A | * | 11/1992 | Sawai | ................. G06F 12/0888 365/201 |
| 5,276,833 A | | 1/1994 | Auvinen et al. | |
| 5,287,481 A | | 2/1994 | Lin | |

(Continued)

FOREIGN PATENT DOCUMENTS

EP    699999 A2    3/1996

OTHER PUBLICATIONS

Manovit, C. et al., "Completely Verifying Memory Consistency of Test Program Executions", IEEE, 2006, pp. 168-177.

*Primary Examiner* — Esaw T Abraham
(74) *Attorney, Agent, or Firm* — Scully, Scott, Murphy & Presser, P.C.

(57) ABSTRACT

A processor memory is stress tested with a variable list insertion depth using list insertion test segments with non-naturally aligned data boundaries. List insertion test segments are interspersed into test code of a processor memory tests to change the list insertion depth without changing results of the test code. The list insertion test segments are the same structure as the segments of the test code and have non-naturally aligned boundaries. The list insertion test segments include list insertion segments and load/store segments. The list insertion segments locate a current memory location using a fixed segment at a known location. The load/store segments load and store list elements in memory.

16 Claims, 11 Drawing Sheets

(56) References Cited

U.S. PATENT DOCUMENTS

| | | | |
|---|---|---|---|
| 5,701,495 A | | 12/1997 | Arndt et al. |
| 5,761,408 A | | 6/1998 | Kolawa et al. |
| 6,038,691 A | * | 3/2000 | Nakao ............ G01R 31/318583 714/733 |
| 6,059,451 A | * | 5/2000 | Scott ................ G01R 31/31835 714/726 |
| 6,182,246 B1 | | 1/2001 | Gregory et al. |
| 6,560,721 B1 | | 5/2003 | Boardman et al. |
| 6,591,385 B1 | | 7/2003 | Krech, Jr. et al. |
| 6,684,359 B2 | | 1/2004 | Noy |
| 7,428,672 B2 | | 9/2008 | Kaginele |
| 7,533,309 B2 | | 5/2009 | Mukherjee et al. |
| 7,752,499 B2 | | 7/2010 | Choudhury et al. |
| 7,788,610 B2 | | 8/2010 | Emek et al. |
| 7,992,059 B2 | | 8/2011 | Anvekar et al. |
| 8,280,713 B2 | * | 10/2012 | Adir ..................... G06F 11/263 703/14 |
| 8,826,202 B1 | * | 9/2014 | Goel .................... G06F 11/263 716/106 |
| 9,218,261 B2 | * | 12/2015 | Holden ................ G06F 11/263 |
| 2001/0007970 A1 | * | 7/2001 | Kohno ................. G06F 11/263 702/117 |
| 2004/0015864 A1 | | 1/2004 | Boucher |
| 2006/0136788 A1 | * | 6/2006 | Hsu .................... G06F 11/2257 714/42 |
| 2008/0147689 A1 | * | 6/2008 | Uehara ............... G06F 11/3684 |
| 2009/0271661 A1 | * | 10/2009 | Miyai ................... G06F 11/263 714/35 |
| 2009/0276663 A1 | * | 11/2009 | Kaksonen ............ G06F 11/263 714/25 |
| 2011/0145643 A1 | * | 6/2011 | Kumar .................. G06F 11/263 714/33 |
| 2016/0306690 A1 | | 10/2016 | Underseth et al. |

* cited by examiner

800

| mfLR r3 | addi r4, r3,4 | mtLR r4 | blrl | Parent | Instr. | Instr. |
|---|---|---|---|---|---|---|
| 810 | 812 | 814 | 816 | 818 | 820 | |

| mfLR r5 | bcl_ea | Child | mflr r4 | mtlr r5 | bc +116 | Instr. |
|---|---|---|---|---|---|---|
| 910 | 912 | 914 | 916 | 918 | 920 | |

| lwarx r5, r0, r4 | stw r5, 0(r3) | lwsync/sync | stwcx. r3, r0, r4 | bne- -0x10 | bc +116 | Instr. |
|---|---|---|---|---|---|---|
| 1010 | 1012 | 1014 | 1016 | 1018 | | |

| addi r3,r0,0x7ff | addi r3,r3,-1 | tweqi r3,0 | lwz r4,0(r4) | cmpwi cr7,r4,0 | bne- -0x10 | bc +112 |
|---|---|---|---|---|---|---|
| 1110 | 1112 | 1114 | 1116 | 1118 | 1120 | 1122 |

| | | 1 | 2 | 3 | 4 | 5 | 6 | 7 |
|---|---|---|---|---|---|---|---|---|
| 800 | X | mfLR r3 | addi r4, r3,4 | mtLR r4 | blrl | Parent | Instr. | Instr. |
| 900 | A | mfLR r5 | bcl_ea | Child | mflr r4 | mtlr r5 | bc +116 | Instr. |
| 1000 | B | lwarx r5, r0, r4 | stw r5, 0(r3) | lwsync/sync | stwcx. r3, r0, r4 | bne- -0x10 | bc +116 | Instr. |
| 1100 | C | addi r3,r0,0x7ff | addi r3,r3,-1 | tweqi r3,0 | lwz r4,0(r4) | cmpwi cr7,r4,0 | bne- -0x10 | bc +112 |

|   | 1 | 2 | 3 | 4 | 5 | 6 | 7 |
|---|---|---|---|---|---|---|---|
| X | mfLR r3 | addi r4, r3, 4 | mtLR r4 | blrl | Parent | Instr. | Instr. |
| A | a1 | a2 | a3 | a4 | a5 | a6 | a7 |
| B | mfLR r5 | bcl_ea | Child | mflr r4 | mtlr r5 | bc +116 | Instr. |
| C | lwarx r5, r0, r4 | stw r5, 0(r3) | lwsync/sync | stwcx. r3, r0, r4 | bne -0x10 | bc +116 | Instr. |
| D | d1 | d2 | d3 | d4 | d5 | d6 | d7 |
| E | e1 | e2 | e3 | e4 | e5 | e6 | e7 |
| F | mfLR r5 | bcl_ea | Child | mflr r4 | mtlr r5 | bc +116 | Instr. |
| G | lwarx r5, r0, r4 | stw r5, 0(r3) | lwsync/sync | stwcx. r3, r0, r4 | bne -0x10 | bc +116 | Instr. |
| H | addi r3, r0, 0x7fff | addi r3, r3, -1 | tweqi r3, 0 | lwz r4, 0(r4) | cmpwi cr7, r4, 0 | bne -0x10 | bc +112 |
| I | h1 | h2 | h3 | h4 | h5 | h6 | h7 |

LIST INSERTION IN TEST SEGMENTS WITH NON-NATURALLY ALIGNED DATA BOUNDARIES

CROSS-REFERENCE TO RELATED APPLICATION

This patent document is a divisional of, and claims priority to, U.S. patent application Ser. No. 15/850,201, filed Dec. 21, 2017, now U.S. Pat. No. 10,438,682. The disclosure of the priority application is fully incorporated by reference.

BACKGROUND

This disclosure generally relates to computer hardware testing and development, and more specifically relates to a system and method for list insertion of test segments with non-naturally aligned data boundaries into a processor memory.

Processor testing tools attempt to generate the most stressful test case for a processor. In theory, the generated test case should provide maximum test coverage and should be able to stress various timing scenarios and operations on the processor, including the coherency of cache memory. Coherency in the cache memory involves insuring that changes to data in the cache are accurately reflected to main memory to keep the data consistent. Building test cases to thoroughly test a processor can be extremely costly in time and resources, thus building efficient test cases is an important goal of processor testing.

Many processors have restrictions on alignment for memory operations. For example, some Power processors allow different alignment boundaries in memory for different instructions while in different modes like Cache Inhibited, Little Endian etc. With these complexities on boundary restrictions, it's very difficult to generate test cases for the different alignment boundaries for each of the instructions. Moreover, testing all valid boundaries for an instruction is very important and multiple test cases for multiple boundaries would have the overhead of generation and simulation in case of reference model checking. Test case generation can be extremely labor intensive to test the different alignment boundaries while preserving boundaries where needed.

SUMMARY

A system, method and/or computer program product for testing a computer processor is disclosed. An apparatus for testing a computer processor having a plurality of registers includes a test case generator that creates test cases with test code for testing the computer processor, a test case executor that replicates the test code and loads the replicated test code into non-naturally aligned segments of consecutive memory locations on the computer processor, and a load-store unit that loads and stores data in the memory locations and loads and stores data in the plurality of registers. The test case executor further adds one or more list insertion test segments and each list insertion test segment comprises a list insertion segment and a load/store segment. The list insertion test segments are interspersed in the test code in non-naturally aligned segments that insert a list element into at least one of a plurality of list element locations using a fixed segment stored at a fixed location on the computer processor.

The method utilizes test code inserted in a plurality of memory segments with non-naturally aligned boundaries. Non-naturally aligned means that the ends of the segments when placed end-to-end with another segment do not fall on a natural boundary that is a number of the form 2n. The test code with the non-naturally aligned segments may have seven words of test code comprising one single word sub-segment, one double word sub-segment and one quad word sub-segment. A plurality of list insertion test segments that have non-naturally aligned boundaries are interspersed into the test code segments. The list insertion test segments comprise at least one list insertion segment and at least one load/store segments. The list insertion test segments may also comprise a checking segment. Each list insertion segment branches to a fixed segment that determines a first list element location and that includes a second list element location. Each load/store segment that loads a list element stored in the second list element location, stores the list element in the first list element location. The test code is executed with the interspersed list insertion test segments to insert a list element into at least one of a plurality of list element locations using a fixed segment stored at a fixed location on the computer processor.

The method determines a second list element location by storing an address to a next consecutive memory location contained in a link register of the computer processor into one of a plurality of general purpose registers of the computer processor. The method continues by branching to the fixed segment, storing an address to the first list element location contained in the link register into a second of the plurality of general purpose registers, and calculating an address to a return memory location consecutive to the first list element location and storing the return memory location to the link register. The method branches to the return memory location and restores the address to the next consecutive memory location to the link register.

The load/store segment includes instructions that add list elements to a linked list. A list element stored in the second list element location is loaded from memory into one of the plurality of general purpose registers, and the list element in this register is stored the list element into the first list element location. Write access to the second list element location is prohibited and it is determined whether another process attempts to write to the second list element location after write access has been prohibited. If another process has attempted to write to the list element after write access has been prohibited, the steps of loading from memory the list element, prohibiting write access to the second list element location, and determining whether another process attempts to write to the second list element location are repeated until no process attempts to write to the second list element location after write access has been prohibited. If no process has attempted to write to the second list element location after write access has been prohibited, write access to the second list element location is enabled and the address to the first list element location is stored into the second list element location.

The checking segment may include instructions that initialize and run a counter loop to check that the linked list has been inserted correctly. The checking segment may operate, for example, by checking the content of a memory address stored in a general purpose register that points to the last item inserted in a linked list. The checking segment may load the content of the memory location pointed to in each successive list item until the beginning of the list is reached. A parent list element may have an initial value of 0. Once the content of the general purpose register is zero, the checking segment confirms the list insertion test segments have executed correctly.

The foregoing and other features and advantages will be apparent from the following more particular description, as illustrated in the accompanying drawings.

BRIEF DESCRIPTION OF THE SEVERAL VIEWS OF THE DRAWING(S)

The various aspects, features and embodiments of the memory system, architectural structure and its method of operation will be better understood when read in conjunction with the figures provided. Embodiments are provided in the figures for the purpose of illustrating aspects, features and/or various embodiments of the memory system, architectural structure and method of operation, but the claims should not be limited to the precise arrangement, structures, features, aspects, embodiments or devices shown, and the arrangements, structures, subassemblies, features, aspects, embodiments, methods, and devices shown may be used singularly or in combination with other arrangements, structures, subassemblies, features, aspects, embodiments, methods and devices.

Figure 5:
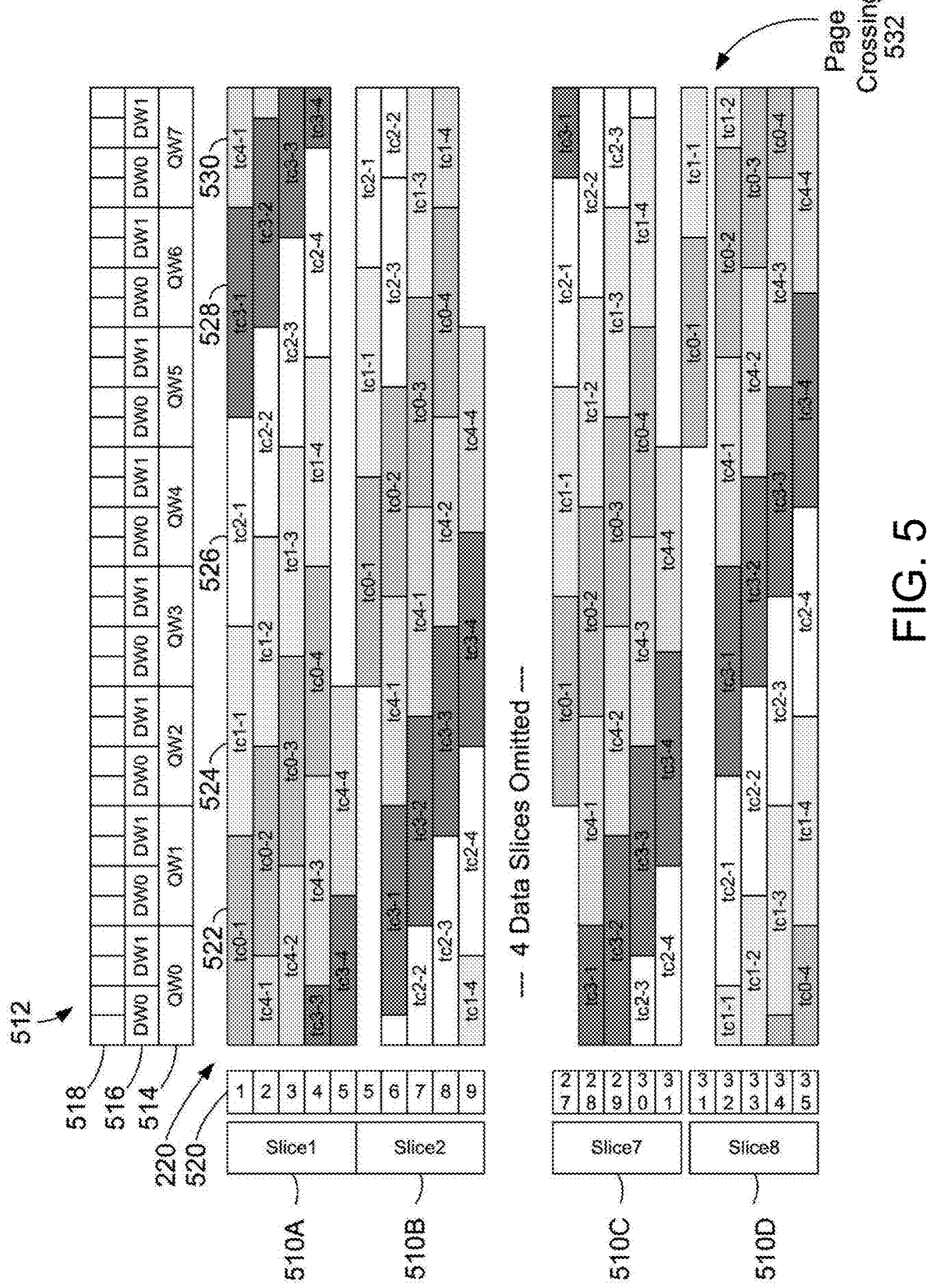
FIG. 5 illustrates successive slices of replicated test code and test data stored in a memory cache with non-naturally aligned data boundaries.
Figures 6, 7:
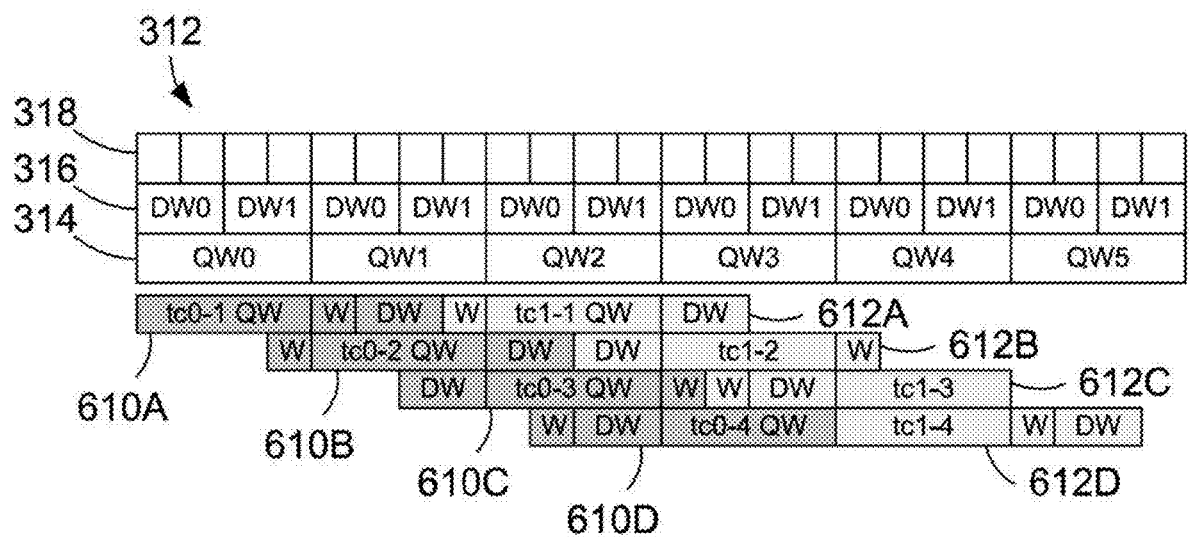

FIG. 6 further illustrates the test code segments in FIG. 5 having non-naturally aligned data boundaries.

FIG. 7 illustrates a portion of the memory cache shown in FIG. 5 with a strand of memory shown as a single block.

FIG. 8 illustrates an example of a fixed code segment that resides in a known, fixed location.

FIG. 9 illustrates an example of a list insertion code segment.

FIG. 10 illustrates an example of a load/store code segment.

FIG. 11 illustrates an example of a checking code segment.

FIG. 12 illustrates strands of memory containing the test code segments in FIGS. 8, 9, 10, and 11.

FIG. 13 illustrates strands of memory containing the test code segments in FIGS. 8, 9, 10, and 11 including multiple copies of test code segments.

Figure 14:
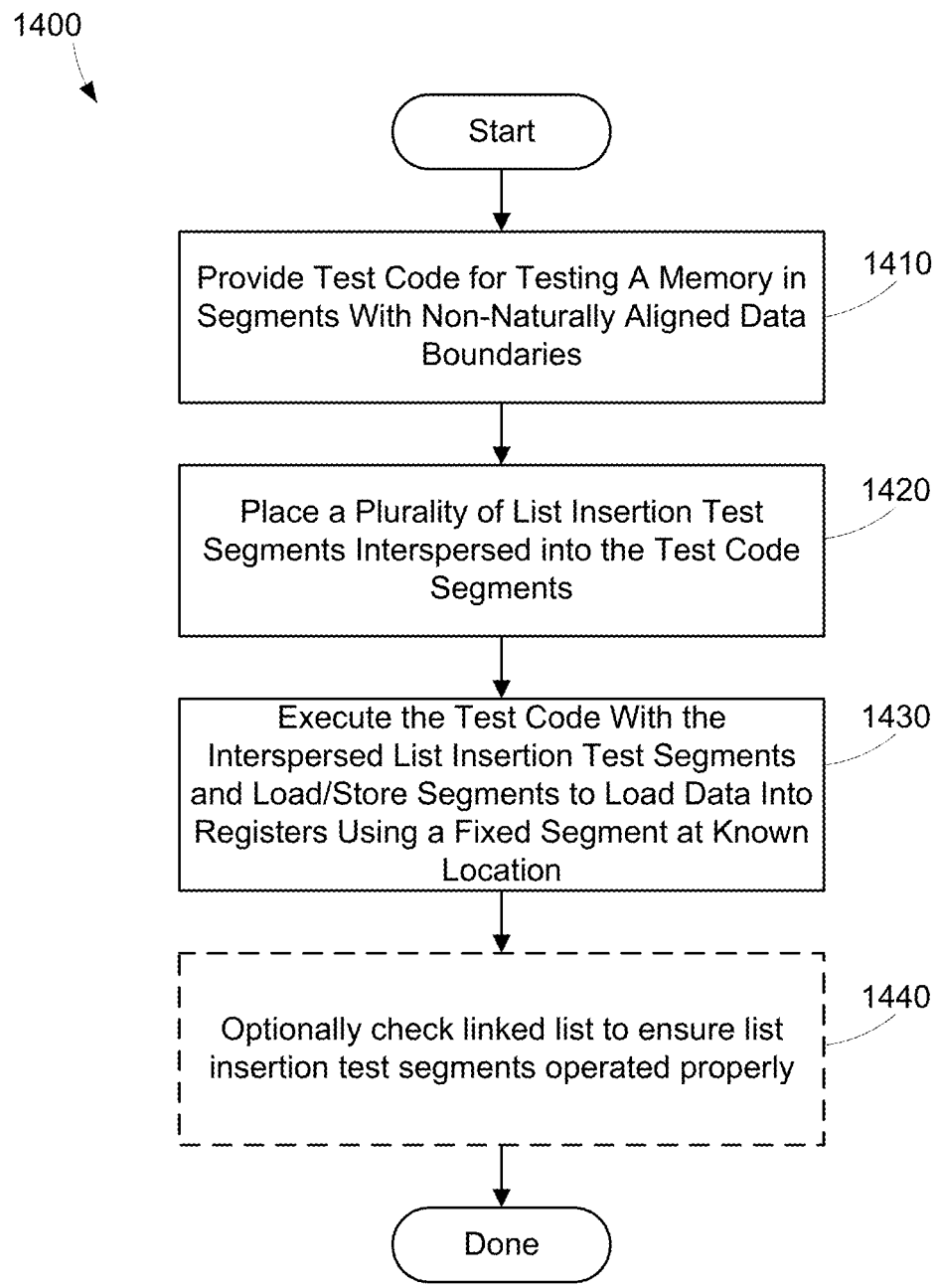

FIG. 14 is a flow diagram of a method for stress testing a processor memory cache using list insertion test segments with non-naturally aligned data boundaries.

Figure 15A:
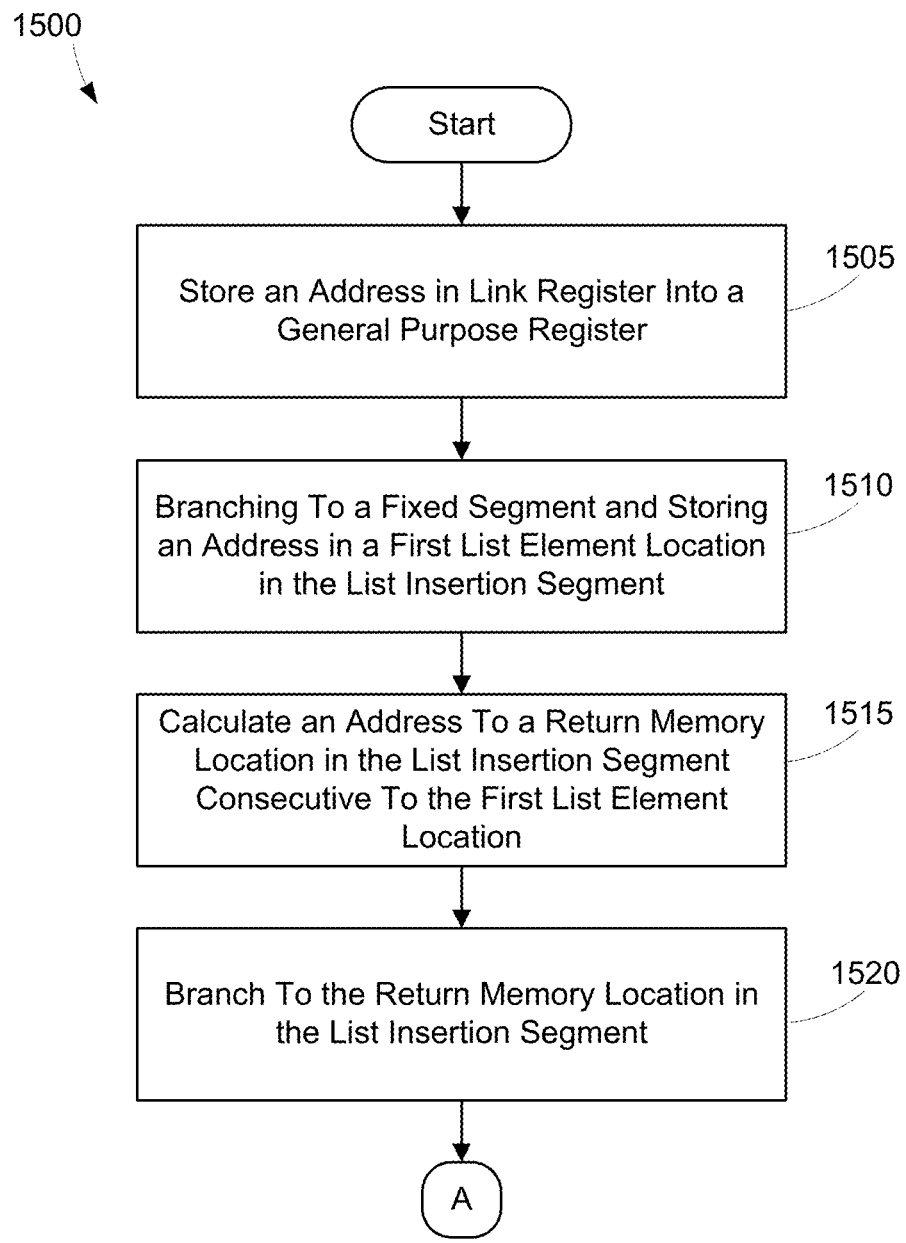
Figure 15B:
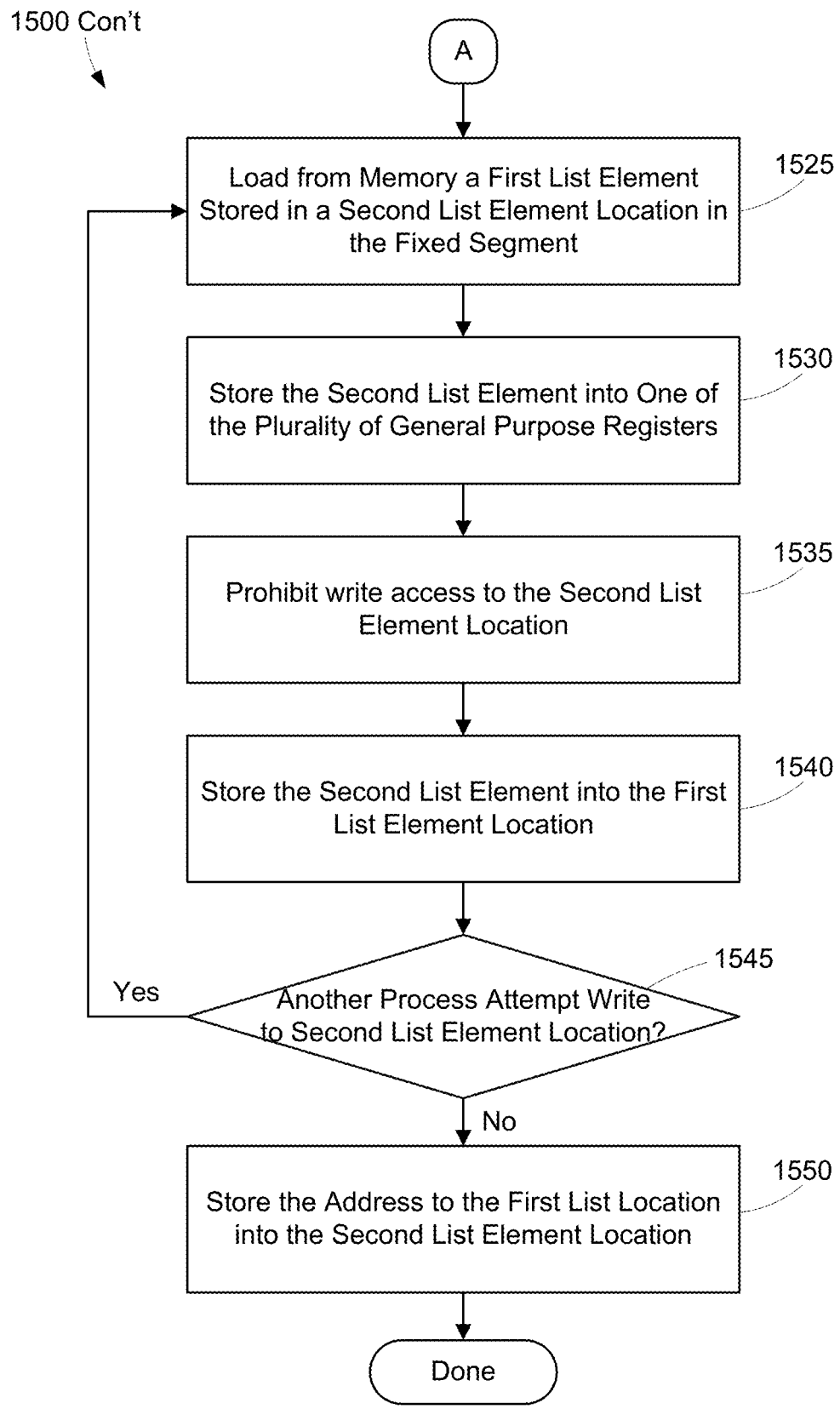

FIGS. 15A-B are a flow diagram of a specific method for step 1430.

Figure 16:
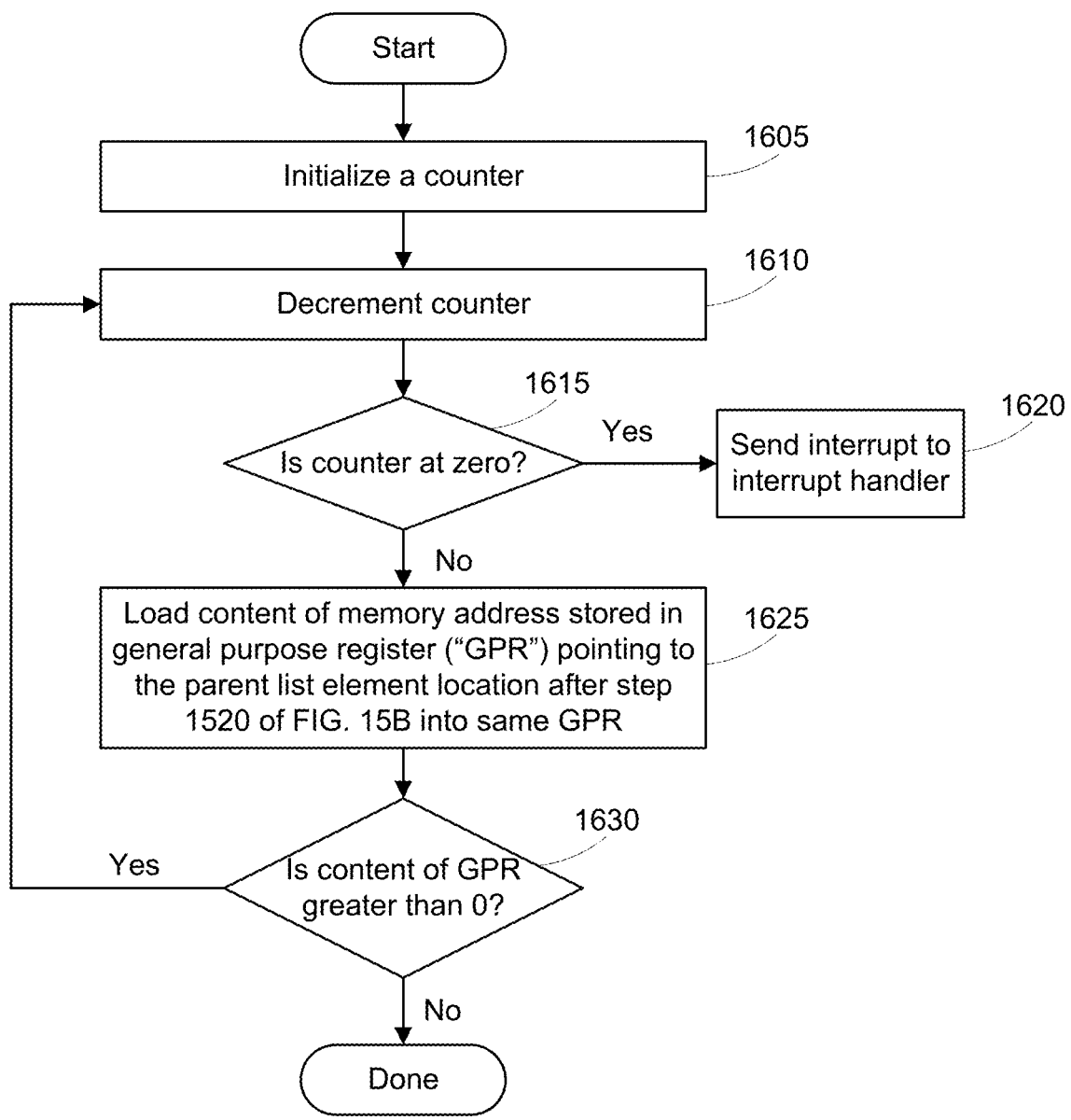

FIG. 16 is a flow diagram of a specific method for step 1440.

DETAILED DESCRIPTION

The following description is made for illustrating the general principles of the invention and is not meant to limit the inventive concepts claimed herein. In the following detailed description, numerous details are set forth in order to provide an understanding of the memory system, architectural structure and method of operation, however, it will be understood by those skilled in the art that different and numerous embodiments of the memory system, architectural structure and method of operation may be practiced without those specific details, and the claims and invention should not be limited to the embodiments, subassemblies, features, processes, methods, aspects, features of details specifically described and shown herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified.

The disclosure and claims herein relate to a system and method for stress testing a processor memory using list insertion test segments with non-naturally aligned data boundaries. List insertion test segments are interspersed into test code of processor memory tests to change the list insertion depth without changing results of the test code. The list insertion test segments are the same structure as the segments of the test cases and also have non-naturally aligned boundaries. The list insertion test segments include a list insertion segment and a load/store segment. A fixed segment may be located at a suitable known location in memory and maybe outside the strand of memory. In some embodiments, the list insertion segment may branch to the fix segment to obtain an address of one or more list element locations in memory and the load/store segment may perform a series of memory operations to insert list elements into the list element locations determined by the list insertion and fixed segments. Optionally, the list insertion test segments may also include a checking segment that confirms proper operation of the list insertion and load/store segments.

Figure 1:
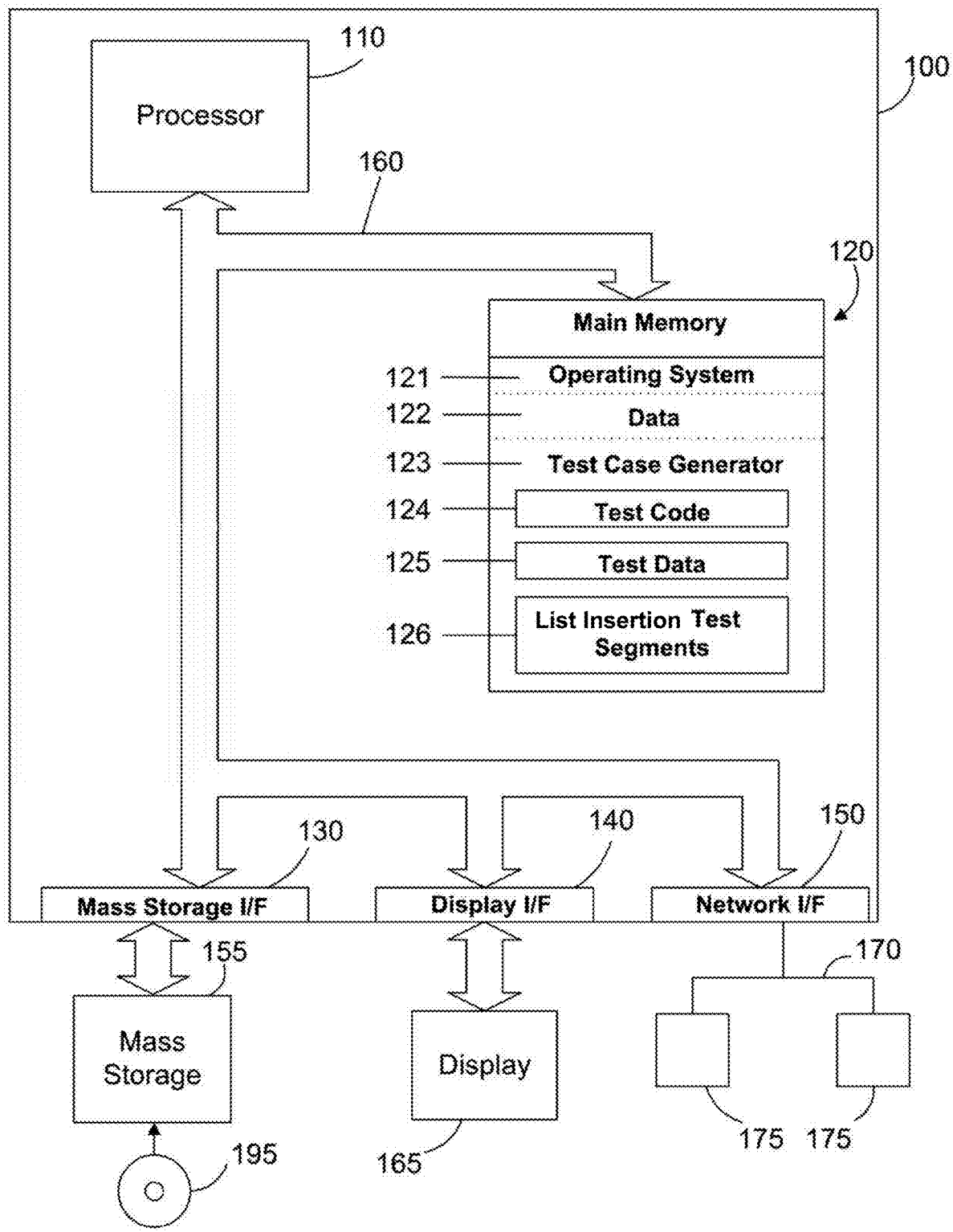
FIG. 1 is a block diagram a computer system with a test case generator as described herein to generate test code and place it in segments of a data cache with non-naturally aligned data boundaries.

Referring to FIG. 1, a computer system 100 is one suitable implementation of a computer system that is capable of performing the computer operations described herein including a test case generator for generating test cases for stress testing a processor memory and/or a test case executor as described herein. Computer system 100 is a computer which can run multiple operating systems including the IBM i operating system. However, those skilled in the art will appreciate that the disclosure herein applies equally to any computer system, regardless of whether the computer system is a complicated multi-user computing apparatus, a single user workstation, laptop, phone or an embedded control system. As shown in FIG. 1, computer system 100 comprises one or more processors 110. The computer system 100 further includes a main memory 120, a mass storage interface 130, a display interface 140, and a network interface 150. These system components are interconnected through the use of a system bus 160. Mass storage interface 130 is used to connect mass storage devices with a computer readable medium, such as mass storage 155, to computer system 100. One specific type of mass storage 155 is a readable and writable CD-RW drive, which may store data to and read data from a CD-RW 195. Some mass storage devices may have a removable memory card or similar instead of the CD-RW drive.

Main memory 120 preferably contains an operating system 121. Operating system 121 is a multitasking operating system known in the industry as IBM i; however, those skilled in the art will appreciate that the spirit and scope of this disclosure is not limited to any one operating system. The memory 120 further includes data 122 and a test case generator 123. The memory 120 also includes test code 124 and test data 125 which is typically created by the test case generator 123. The memory also includes list insertion test segments 126 for testing the memory with different list insertion scenarios as described herein.

Computer system 100 utilizes well known virtual addressing mechanisms that allow the programs of computer system 100 to behave as if they only have access to a large, single storage entity instead of access to multiple, smaller storage entities such as main memory 120 and mass storage 155. Therefore, while operating system 121, data 122, test case generator 123, test code 124, test data 125 and list insertion test segments 126 are shown to reside in main memory 120, those skilled in the art will recognize that these items are not necessarily all completely contained in main memory 120 at the same time. It should also be noted that the term "memory" is used herein generically to refer to the entire virtual memory of computer system 100, and may include the virtual memory of other computer systems coupled to computer system 100.

Processor 110 may be constructed from one or more microprocessors and/or integrated circuits. Processor 110 executes program instructions stored in main memory 120. Main memory 120 stores programs and data that processor 110 may access. When computer system 100 starts up, processor 110 initially executes the program instructions that make up operating system 121 and later executes the program instructions that make up the test case generator 123 to generate the test code 124 and the test data 125 as directed by a user.

Although computer system 100 is shown to contain only a single processor and a single system bus, those skilled in the art will appreciate that the system may be practiced using a computer system that has multiple processors and/or multiple buses. In addition, the interfaces that are used preferably each include separate, fully programmed microprocessors that are used to off-load compute-intensive processing from processor 110. However, those skilled in the art will appreciate that these functions may be performed using I/O adapters as well.

Display interface 140 is used to directly connect one or more displays 165 to computer system 100. These displays 165, which may be non-intelligent (i.e., dumb) terminals or fully programmable workstations, are used to provide system administrators and users the ability to communicate with computer system 100. Note, however, that while display interface 140 is provided to support communication with one or more displays 165, computer system 100 does not necessarily require a display 165, because all needed interaction with users and other processes may occur via network interface 150, e.g. web client based users.

Network interface 150 is used to connect computer system 100 to other computer systems or workstations 175 via network 170. Network interface 150 broadly represents any suitable way to interconnect electronic devices, regardless of whether the network 170 comprises present-day analog and/or digital techniques or via some networking mechanism of the future. In addition, many different network protocols can be used to implement a network. These protocols are specialized computer programs that allow computers to communicate across a network. TCP/IP (Transmission Control Protocol/Internet Protocol) is an example of a suitable network protocol.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the system, method and/or computer program product are described herein with reference to flowchart illustrations and/or block diagrams of embodiments of methods, apparatus (systems), and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
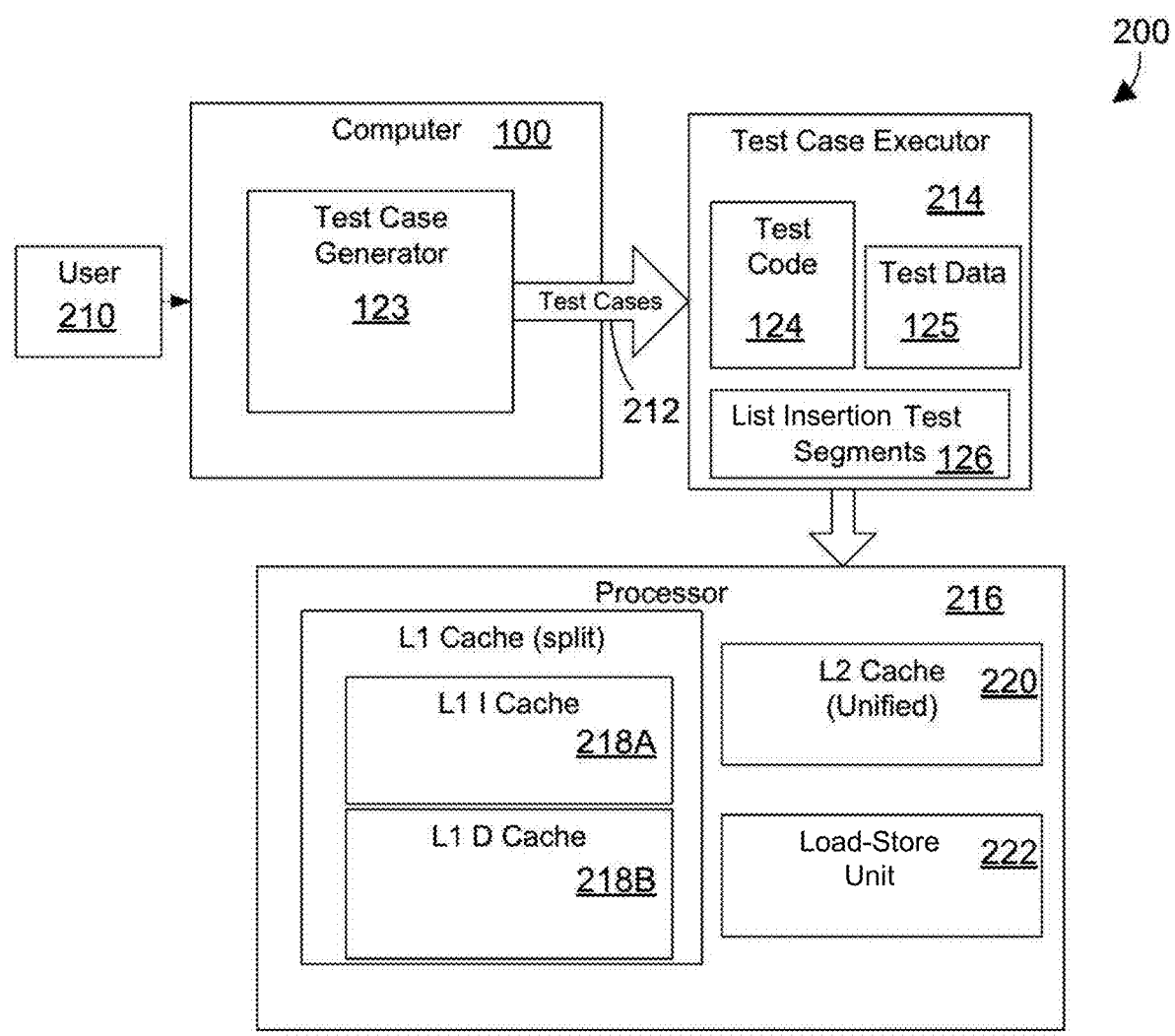
FIG. 2 illustrates simplified block diagrams of a system for testing a processor with test code and list insertion test segments placed in segments of a cache with non-naturally aligned data boundaries.

FIG. 2 illustrates a simplified block diagram of a system 200 for reducing the time needed to generate test cases for testing a processor by replicating test code and test data and placing slices of the test code and test data into a memory cache where the slices of the replicated test code and test data have non-naturally aligned data boundaries. A user 210 or an operator uses the test case generator 123 to provide tests cases 212 to a test case executor 214. The test case generator 123 and the test case executor 214 operate in a manner similar to the prior art except as described herein. The test cases 212 include test code 124 and test data 125. The test case executor 214 loads the test code 124, test data 124 and the list insertion test segments 126 into a processor 216 to verify and validate the processor design.

Again referring to FIG. 2, the processor 216 has a typical cache design with one or more caches. In the illustrated example, the processor 216 has a split L1 cache 218 and a unified L2 cache 220. The split L1 cache 218 means the L1 cache 218 is split between an L1 instruction cache 218A and an L1 data cache 218B. When instructions and data are needed by the processor, the processor first looks to the L1 cache 218 to load the instructions and data. If the needed instructions and data are not in the L1 cache 218, then the L2 cache is searched for the needed instructions and data and loaded into the L1 cache from the L2 cache if available. If the needed instructions and data are not in the L2 cache, then they are loaded from main memory. Alternatively an additional level of cache (L3 cache) can be used but is not shown here for simplicity. The test code 124 and test data 125 are loaded into the L2 cache 220 and then to the L1 cache 218 as described further below. The test case executor 214 replicates the test code 124, placing multiple copies of the test code into the L2 cache 220, and then the test code is executed by the processor to test proper handling of data coherency as described further below. The test case executor 214 may also replicate the test data 125 into the L2 cache 220. The processor 216 further includes a load-store unit 222 or call return stack that can be used to predict a target address of a branch to improve performance.

Figure 3:
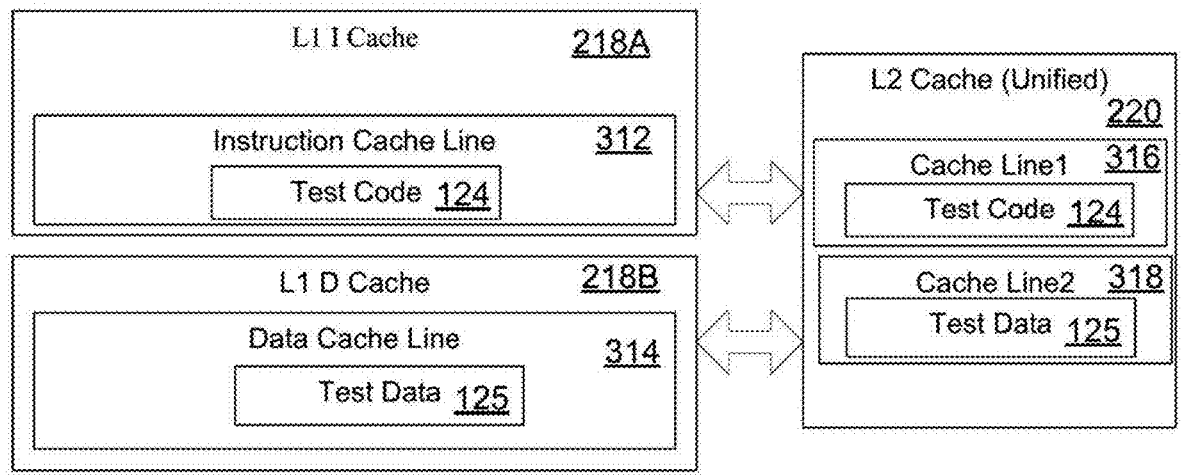
FIG. 3 is a simplified block diagram of a memory cache system in a processor with test code and test data placed in different cache lines in a level two memory cache.

FIG. 3 illustrates an example of loading the L1 cache 218 from the L2 cache 220 of the processor 216 (shown in FIG. 2) where the test code and test data are initially placed in different cache lines in the L2 memory cache. In this example, the L1 instruction cache 218A has a single instruction cache line 312. Similarly, the L1 data instruction cache 218B has a single data cache line 314. Those of ordinary skill in the art will recognize that processors may have multiple cache lines in the instruction cache and the data cache. In such a case, the operation would be similar to the described example. In this example, the test code 124 was initially loaded into cache line1 316. When test code 124 is requested by the L1 instruction cache 218A, the L2 cache 220 provides a cache line containing the requested test code, in this case test code 124 from cache line1 316. Similarly, the test data 125 was initially loaded into cache line2 318. When test data 125 is requested by the L1 data cache 218B, the L2 cache 220 provides a cache line containing the test data 125 from cache line2 318. If the test code makes changes to the test code 124 in the instruction cache line 312 or makes changes to the test data 125 in the data cache line 314 then these changes need to be pushed back to the L2 cache 220 in a manner known in the prior art. Since the test code 124 and the test data 125 are on different cache lines, this example illustrates the simple case of maintaining memory coherency between the L1 and L2 caches. If the processor or test code detects an error in data coherency between the caches or main memory, the processor being tested can be flagged as having a potential memory failure in a manner known in the prior art.

Figure 4:
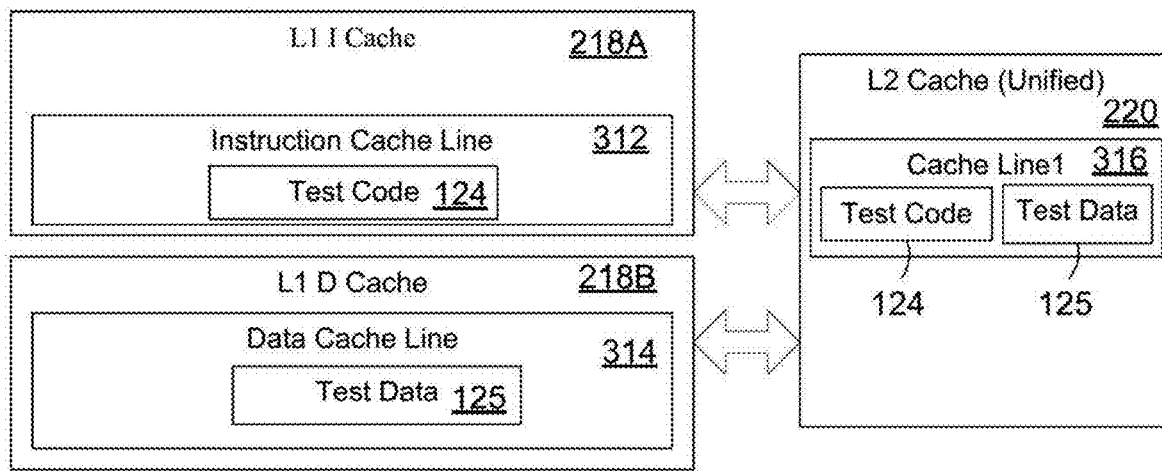
FIG. 4 is a simplified block diagram of a memory cache system in a processor with test code and test data placed in the same cache lines in a level two memory cache.

FIG. 4 illustrates another example of loading the L1 cache 218 from the L2 cache 220 of the processor 216 (shown in FIG. 2). In this example, the test code and test data are initially placed in the same cache line in the L2 memory cache. As in the previous example, the L1 instruction cache 218A and the L1 data instruction cache 218B each have a single cache line. In this example, the test code 124 was initially loaded into cache line1 316. When test code 124 is requested by the L1 instruction cache 218A, the L2 cache 220 provides the test code 124 from cache line1 316. The test data 125 was initially loaded into the same cache line1 316. When test data 125 is requested by the L1 data cache 218B, the L2 cache 220 provides the test data 125 from cache line1 316. If the test code makes changes to the test code 124 in the instruction cache line 312, or if the test code makes changes to the test data 125 in the data cache line 314 then these changes need to be reflected in the L1 cache and pushed back to the L2 cache 220. This example illustrates the case of maintaining memory coherency between the L1 and L2 caches where test code 124 and the test data 125 are loaded into the L1 cache 218 from the same cache lines in the L2 cache 220.

FIG. 5 illustrates additional detail of successive slices of the L2 memory cache with replicated test cases (tc0-1, tc1-1, etc.) placed in segments of memory with non-naturally aligned data boundaries. Thus, FIG. 5 represents a simplified representation of a portion of the level 2 cache 220 introduced above. In the illustrated example, the cache 220 illustrates four replicated slices 510 that can contain test code or test data (described further below). The table 512 above the cache data illustrates how the cache lines of the cache are divided. A cache line in the cache is divided into eight quad words 514. The quad words 514 are labeled QW0 through QW7. Each quad word 514 is divided into two double words 516. The double words for each quad word are labeled DW0 and DW1. Each double word 516 is further divided into two words 518 (not labeled). In this example, each word is four bytes of memory space. Thus each cache line has eight quad words with 128 bytes of memory. Thus the level 2 cache 220 is divided into lines of memory 520 with 128 bytes in each line. In the illustrated portion of level 2 cache 220 shown in FIG. 5, lines 1-9 and 27-35 are shown with the line number 520 shown for each line at the left side of the drawing.

Again referring to FIG. 5, the memory represented in the level 2 cache 220 is divided into slices 510 as shown. For simplification of the drawing, only four slices of the memory cache are actually shown. Slices 3 through 6 are omitted from the drawing but follow the same pattern as the other slices. Slice1 510A begins on line1 of the cache and ends near the middle of line 5. Line 5 is shown twice at the left of the drawings. This is done for illustration so that it can be clearly seen where slice1 510A ends and slice2 510B begins. In the cache there is actually only one line of memory designated as line 5. Slice2 510B begins at the end of slice1 510A near the middle of line 5 and ends near the end of line 9. Slice7 510C begins at the end of slice6 (not shown) near the middle of line 27 and ends near the end of line 31. Slice8 510D begins at the end of slice7 510C near the middle of line 31 and ends at the end of line 35.

Again referring to FIG. 5, each slice of memory 510 includes several strands of test cases. In this example, there are five strands of test cases (tc0 through tc4) divided into four segments each. The segments of each strand are shown with the same shading in FIG. 5. The segment of the strand is indicated by the number after the dash. Thus tc0-1 522 is the first segment of test case zero, tc1-1 524 is the first segment of test case one, tc2-1 526 is the first segment of test case 2, tc3-1 528 is the first segment of test case 3 and tc4-1 530 is the first segment of test case four. Test case zero (tc0) includes tc0-1, tc0-2, tc0-3 and tc0-4. Similarly the other test case strands include four segments. As can be seen using the table 512 above the cache, each of the segments has a test case that is seven words long. It is important to note that the seven word length of the segments means that each of the test cases are on non-naturally aligned word boundaries. Non-naturally aligned means that when the segments of the test cases are placed end-to-end the end of the segments does not fall on a natural boundary that is a number of the form $2^n$. This is accomplished by having segments with an odd number of words. In this example this means that the beginning and end of each of the test case segments does not line up with 32 byte, cache line (128 byte) and page crossing boundaries. For example, the page crossing boundary 532 is within the test case tc1-1 at the boundary between line 31 and line 32 as shown in FIG. 5. Since the segments are non-naturally aligned, after replication alignment boundaries change for tests on subsequent segments to allow more robust testing of the processor using the same repeated test code. In cases where alignment boundaries need to be respected for a few instructions, these instructions are placed in sub-segments with special alignment locations so that they preserve alignment even after replication and re-execution on new segments as described below.

FIG. 6 further illustrates a portion of the memory cache shown in FIG. 5 having test cases with test code and test data on non-naturally aligned data boundaries. FIG. 6 illustrates the first two strands of the five strands of test cases shown in FIG. 5, namely tc0 610 and tc1 612. Test case zero (tc0) 610 includes four segments 610A, 610B, 610C and 610D. Similarly, test case one (tc1) 612 includes four segments 612A, 612B, 612C and 612D. As described above, each segment of the cache has a test case that is seven words long. The test case segment is divided into three sub-segments. In this example, the sub-segments include a quad word, a double word and a single word for a total of seven words. The order of the sub-segments changes for each segment in the test case strand in order that the test cases within the strings can observe word boundaries where needed. The first segment 610A of test case zero (tc0) has a quad word followed by a word and then a double word. In the next segment of tc0 610B there is a word, a quad word and then a double word. In the next segment of tc0 610C there is a double word, a quad word and then a single word. In the final segment of tc0 610D there is a single word, a double word and then the quad word. Similarly the tc1 alternates the single word, double word and quad word in subsequent segments as shown in 612A, 612B, 612C and 612D.

In the example described above, each segment of the test cases has seven words to insure that the test case data has non-naturally aligned data boundaries. By having non-naturally aligned data boundaries for each segment of the slice of test data, testing can be done on the replicated test cases to test various boundaries. These boundaries include 32 byte boundaries, cache line boundaries (128 bytes) and page crossing boundaries. The test case segment is divided into sub-segments of word, double word and quad word and the order of the sub-segments changes for each segment in the test case strand. Dividing into sub-segments and changing of the order of the sub-segments insures that the data for test cases within the sub-strings can observe and preserve double word and quad word boundaries where needed. Using non-naturally aligned data boundaries with replicated code insures that all types of segments will cross the boundaries at some replication of the test data. This allows testing of the boundaries without using special code to look at the restrictions of a particular segment for each of the boundaries.

The examples described above illustrate a preferred test case segment with 7 words to achieve non-naturally aligned data boundaries. Other non-naturally aligned data boundaries could include other odd numbers such as 5, 9, 11, etc. A combination of word, double word and quad word could be chosen as sub-segments for these segments similar to the described example. For example, for a segment with 9 words, a quad word, two double words and a word would achieve the correct number of sub-segments for 9 words. The sub-segments could be changed for each segment in a strand as described above for the 7 word example.

FIG. 7 illustrates a portion of the memory cache shown in FIG. 5. The memory shown in FIG. 7 is a sequence of segments or a strand of memory 700 shown as a single block. The strand of memory 700 may be modified to include list insertion scenarios to stress test memory and the list insertion as described herein. In this example, the strand of memory 700 includes the strand segments 610 described in FIG. 6. Each of the segments in this example includes seven words of memory. Segment 610A includes seven words of memory a1 through a7. Similarly, segments 610B, 610C and 610D each include seven words of memory. Additional segments labeled as e, f, g, h, and i are also shown in the strand 700. These segments are not consecutive memory locations, but are shown here as a block of memory that are logically in the strand and used for testing the cache memory of the processor 216 (FIG. 2). In this example, each segment 610 of the strand 700 is loaded with a test case for testing memory by the test case executor 214 as described above. In addition, the test case executor 214 may load list insertion test blocks into the strand 700 as described below.

FIG. 8 illustrates an example of a fixed segment 800. The fixed segment 800 is a single segment. In the illustrated examples, the segments each have seven words with data or instructions. The fixed segment 800 serves to determine the location of a list element location in another segment of memory. In this case, the fixed segment 800 determines the location of a child pointer in a list insertion segment that branches to the fixed segment, for example list insertion segment 900 discussed below in reference to FIG. 9. The first instruction in fixed segment 800, "mfLR r3" 810, moves the contents of the link register to general purpose register ("GPR") r3. A link register in the processor holds return address which is equal to the next consecutive memory location after the location of any branch and/or link instruction that was most recently executed. For example, after the execution of the instruction in memory location 912, the link register contains an address pointing to memory location 914. Saving the link register into GPRs at certain times enables a process to return to the next instruction after branching to various other locations and execute instructions at those locations. In this example, the link register points to the child list element location 914, as explained in further detail below in reference to FIG. 9. The next instruction, "addi r4, r3,4" 812, adds a value of four to the address stored in r3 and stores the result in GPR r4. In this example, register r4 points to memory location 916 of FIG. 9 after the execution of the addi instruction. The next instruction, "mtLR r4" 814, moves the contents of GPR r4, e.g. an address for memory location 916, to the link register. The next instruction, "blrl" 816, branches to the address stored in the link register. In this example, when the blrl instruction is executed, the processor branches to memory location 916 to which the address currently in the link register points. Also included in fixed segment 800 is parent list element memory location 818. In this example, the parent list element memory location holds an initial value of zero. Also included in fixed segment 800 are one or more speculative instructions 820 which are, in this example, not executed during list insertion.

FIG. 9 illustrates an example of a list insertion segment 900. List insertion segment 900 includes instructions that branch to fixed segment 800 as well as memory locations for the storage of list elements. The first instruction of list insertion segment 900, "mfLR r5" 910, moves the contents of the link register to GPR r5. The next instruction, "bcl_ea" 912, branches to a fixed location elsewhere in the computer processor memory that corresponds to the location of fixed segment 800. In this example, bcl_ea 912 is a subroutine call that branches to memory location 810 for execution of instructions stored in fixed segment 800, described in more detail above in reference to FIG. 8. The next memory location, child list element location 914, stores the child list element described above. The child list element contains a pointer to the next node in the link list that is being inserted into memory. After branching to fixed segment 800, in this example, the link register points to child list element location 914 because it is the next memory location following the subroutine call that branches to fixed segment 800. As discussed above, the pointer stored in the link register is stored in GPR r3. After the fixed segment branches back to memory location 916, as discussed above, the link register contains an address pointing to parent list element location 818. The next instruction, "mfLR r4" 916, moves the contents of the link register into GPR r4, which now contains the address of parent list element location 818. The next instruction, "mtLR r5" 918, returns the contents of GPR r5 to the link register for execution. The next instruction, "bc+116" 920, branches to the beginning of the next test code segment, in this case, the beginning of the load/store segment 1000 discussed in more detail below in reference to FIG. 10.

FIG. 10 illustrates an example of a load store segment 1000. The load/store segment 1000 performs a memory read/write operation to insert a list element into a list memory location. The first instruction in the load/store segment 1000, "lwarx r5, r0, r4" 1010 is a "load word and reserve indexed" instruction that loads the content of the memory location addressed by the pointer stored in GPR r4 and stores it in GPR r5. In this case r4 points to the parent list element location 818, as discussed above. The lwarx instruction also reserves the memory location, in this example parent list element location 818, to prohibit writes into the memory location until the reservation is released. The next instruction, "stw r5, 0(r3)" 1012, stores the contents of r5 at the memory location addressed by the pointer stored in r3. In this example, r3 points to the child list element location 914. Thus, in this example, the child list element location 914 would have the value that formerly was stored in the parent list element location 818. On a first run of the list insertion test segments 126, the value of the parent list element, and what is stored in child list element location 914 by the stw instruction, is a value of zero. The next instruction, "lwsync/sync" 1014, clears all store instructions already executing. In other words, the list insertion process pauses until all pending stores are completed and all out-of-order stores are prohibited. The next instruction, "stwcx r3, r0, r4" 1016, is a "store word conditional indexed" instruction that stores the content of GPR r3 into the memory location addressed by the pointer stored in GPR r4. As explained above, in this example, the GPR r3 contains the address pointing to the child list element location 914 and GPR r4 contains the address pointing to the parent list element location 818. In this example, after the stwcx instruction is completed, the parent list element location 818 (addressed by the pointer stored in r4) contains an address pointing to the child list element location 914 (the content stored in r3).

The stwcx instruction 1016 also releases the reservation on parent list element location 818 that was created by the lwarx instruction 1010. The stwcx instruction 1016 may only complete if a reservation on the relvant memory location still exists. The next instruction in the load/store segment 1000, "bne- -0x10" 1018, determines whether the reservation still exists, and if so, performs the store operation and releases the reservation. If, however, another process has attempted to write to parent list element location 818 since the reservation was made, the reservation would no longer exist and the stwcx instruction 1016 would be unable to complete. In this case, instructions 1010, 1012, and 1014 are repeated until the reservation created by the lwarx instruction 1010 remains through the execution of the stwcx instruction 1016 and the store instruction is completed and the reservation is released. The bne instruction confirms the stwcx instruction has been completed. The next instruction is identical to instruction 920, which branches to the beginning of the next test code segment which will either be the beginning of another test case or the beginning of a checking segment 1100 discussed in more detail below in reference to FIG. 11.

FIG. 11 illustrates an example of a checking segment 1100. The checking segment 1100 is an optional segment that runs a counter loop to check that the linked list has been inserted correctly. The checking segment operates by checking the content of a memory address stored in a general purpose register that points to the last item inserted in a linked list. In the example of FIGS. 8-10 above, the checking segment would load the content of the memory location pointed to in each successive list item until the beginning of the list is reached. As explained above, parent list element location 818 has an initial value of 0. Thus, once the content of the general purpose register is zero, the checking segment confirms the list insertion test segments have executed correctly. The first instruction in the checking segment 1100, "addi r3, r0,0x7fff" 1110, places a value of 0x7fff into GPR r3. This instruction initializes a counter to a high value, which may be any arbitrary value. Preferably, the value is larger than the length of the linked list that is inserted using the list insertion and load/store segments.

Continuing with FIG. 11, the next instruction in the checking segment 1100, "addi r3, r3, −1" 1112, decrements the counter by a value of one. The next instruction, "tweqi r3, 0" 1114, is a "trap word equal immediate" instruction that generates a program interrupt when two specified values are equal. In this example, the instruction compares the value stored in GPR r3 and 0 and generates a trap-type program interrupt if the value in GPR r3 is equal to zero. GPR r3 contains the counter initialized at instruction 1110. Therefore, in this example, the instruction will generate a trap-type program interrupt if the checking segment loops enough times for the counter to decrement to zero at instruction 1112. The next instruction, "lwz r4, 0(r4)" 1116, is a "load word and zero" instruction that loads a word of data from a specified location in memory into a general purpose register. In this example, the instruction loads the content of the memory location whose effective address is stored in GPR r4 and stores that content into GPR r4. As noted above, after the load/store segment 1000 is executed, GPR r4 contains the address of the parent list element location 818 which, in turn, contains the address of the child list element location 914. Thus, after the execution of the lwz 1116 instruction, GPR r4 will include the address of the child list element location 914. The next instruction, "cmpwi cr7, r4,0" 1118, is a "compare immediate" instruction that compares specified values and sets a conditional register when the value stored in GPR r4 is not greater than 0. Thus, as long as the value in GPR r4 is greater than 0, the conditional register is not set. Since the initial value of the parent list item is 0, the conditional register is set when the beginning of the linked list is reached (and GPR r4 is equal to 0). The next instruction, "bne- -0x10" 1120 checks the conditional register and loops the changing segment 1100 if the conditional register is not set. Otherwise, execution continues with the next instruction, "bc+112" 1122, which branches to the beginning of the next test code segment, which may be the beginning of another test case.

FIG. 12 illustrates an example of the list insertion test segments discussed above in a single figure for simplicity. FIG. 12 is intended to be viewed in conjunction with FIGS. 8, 9, and 10 as described above and FIG. 13 as described below. Row and column identifiers have been added to allow reference to each memory location. Extraneous memory segments have been removed from FIG. 12 for simplicity of presentation. FIG. 13 illustrates a memory strand that includes a number of memory segments, including multiple copies of the list insertion segment and the load/store segment interspersed in a memory strand that includes other segments.

Referring to FIG. 12, the fixed segment 800 is shown separate from the list insertion segment 900 and the load/store segment 1000 to indicate that it is a fixed, known location in memory and is not in memory strand 700 (see FIG. 13). The first instruction (column 1, row A) in the list insertion segment 900 which moves the content of the link register to a GPR, in this example r5. The next instruction, bcl_ea (column 2, row A), causes execution to branch to the fixed segment 800 (column 1, row X). The instruction at this location (column 1, row X) moves the content of the link register following the branch operation to a GPR r3. As noted above, the link register contains an address to return to when a function call completes. GPR r3 will now hold the address of column 3, row A, which is the next address from the branch instruction. Thus, in this example, the address stored in GPR r3 points to the child list element location 914 shown in FIG. 9 and located at column 3, row A. The next instruction (column 2, row X) in the fixed segment 800 performs an address calculation that adds a value of four to the address stored in GPR r3 and stores the result in GPR r4. In this example, the result of the calculation stored in r4 is an address that points to column 4, row A, the next consecutive memory location to the location pointed to by the address in r3. The next instruction in fixed segment 800 (column 3, row X) moves the contents of the GPR r4, in this example an address pointing to the memory location at column 4 row A, to the link register. The next instruction, blrl, branches to the location (column 4, row A) addressed by the contents of the link register. The instruction at this location moves the contents of the link register to the GPR r4. In this example, the link register, following execution of the branch instruction, points to the memory location following the location of the branch instruction, or to column 5, row X. GPR r4 will now hold the address of column 5, row X, which is the next address from the branch instruction.

Thus, in this example, the address stored in GPR r3 points to the parent list element location 818 shown in FIG. 8 and located at column 5, row X. The next instruction, in memory location at column 5, row A moves the contents of GPR r5 into the link register. The next instruction in the list insertion segment 900 is a branch instruction bc+116 (col. 6, row A). This instruction causes execution to advance 116 bytes forward to continue with the first instruction of the next segment of this strand (col. 1, row B), the load/store segment 1000.

Continuing with the example of FIG. 12, the first instruction in the load/store segment 1000 (column 1, row B) is a load word and reserve indexed or "lwarx" instruction that, in this example, loads the word (i.e. the content) from the location in storage specified by the address stored in GPR r4 (parent list element location 818, column 5, row X) into the target GPR r5. The initial value of the parent list element location 818 is zero. In addition, a reservation on the memory location (parent list element location 818, column 5, row X) is created for use by a subsequent store word conditional indexed ("stwcx") instruction. The next instruction at column 2, row B is a store word ("stw") instruction that, in this example, stores the contents of GPR 5 (currently holding the contents of memory location at column 5, row X, the parent list element location 818) at the memory location addressed by the content of GPR r3 (the address of the child list element location 914, column 3, row A). This effectively moves the content of the parent list element location 818 (column 5, row X) to the child list element location 914 (column 3, row A). The next instruction at column 3, row B "lwsync/sync" provides an ordering function that ensures completion of all storage instructions initiated prior to the lwsync/sync, and that no subsequent instructions initiate until after the lwsync/sync instruction completes. When the lwsync/sync instruction completes, all storage accesses initiated prior to the sync instruction are complete. The next instruction at column 4, row B is the stwcx instruction that complements the previous lwarx instruction. If the reservation created by a lwarx instruction exists, the content of GPR r3 is stored into the memory location in storage addressed by the address stored in GPR r4 and the reservation is cleared. Otherwise, the storage is not altered. If the store is performed, the use of the stwcx and lwarx instructions ensures that no other processor, process, or mechanism has modified the target memory location between the time the lwarx instruction is executed and the time the stwcx instruction completes. The next instruction at column 5, row b is a branch instruction, bne, that determines whether the reservation created by the lwarx instruction is lost and the store not performed. If the store is not performed, e.g. because another processor attempted to write at the parent list element location 818 between the execution of the lwarx instruction and the completion of the stwcx instruction, then the branch instruction executes a loop that restarts the load/store segment 1000 and re-executes the lwarx instruction in column 1, row B. If, however, the reservation exists and the store is completed, the next instruction (column 6, row B) causes execution to advance 116 bytes forward to continue with the first instruction of the next segment of this strand (col. 1, row C), the checking segment 1100.

Continuing with the example of FIG. 12, the first instruction in the checking segment 1100 (column 1, row C is an add immediate "addi" instruction that places a high value, in this case 0x7fff) into a general purpose register, in this case GPR r3. This instruction initializes a counter to a high value, which may be any arbitrary value. Preferably, the value is larger than the length of the linked list that is inserted using the list insertion and load/store segments so that the counter will not hit zero before the checking segment loops to reach the first element in the linked list. The next instruction (column 2, row C) is another addi instruction that adds a value of −1 to the counter value in the general purpose register. This, in effect, decrements the counter by a value of one. The next instruction (column 3, row D) is a trap word equal immediate "tweqi" instruction that generates a trap-type program interrupt if the value in GPR r3 is equal to zero. GPR r3 contains the counter initialized by the first instruction in the checking segment (column 1, row C). Therefore, in this example, the instruction will generate a trap-type program interrupt if the checking segment loops enough times for the counter to decrement to zero. The next instruction (column 4, row C) is a load word and zero "lwz" instruction that loads the content of the memory location whose effective address is stored in GPR r4 and stores that content into GPR r4. As noted above, after the load/store segment 1000 is executed, GPR r4 contains the address of the parent list element location 818 which, in turn, contains the address of the child list element location 914. Thus, after the execution of the lwz instruction, GPR r4 will include the address of the child list element location 914. As the checking segment 1100 loops, the content of GPR r4 should eventually reach 0, the initial value of the parent list element location 818. The next instruction (column 5, row C) is a compare immediate "cmpwi" instruction that compares specified values and sets a conditional register when the value in GPR r4 is not greater than 0. Since the initial value of the parent list item is 0, the conditional register is set when the beginning of the linked list is reached (and GPR r4 is equal to 0). The next instruction (column 6, row C) checks the conditional register and loops the changing segment 1100 if the conditional register is not set. Otherwise, execution continues with the next instruction (column 7, row C) which branches to the beginning of the next test code segment, which may be the beginning of another test case.

FIG. 13 illustrates another view of a portion of memory 1300 used for stress tests as described herein. FIG. 13 includes the same or similar strand of memory 700 shown in FIG. 7 where the strand is arranged as a single block. In FIG. 13, the strand of memory 700 has been modified to include list insertion test segments to stress test memory. The list insertion scenarios are added to the test cases in the strand of memory 700 by adding list insertion test segments 126. The list insertion test segments 126A include a list insertion segment 900A and a load/store segment 1000A. The list insertion test segments 126B include a list insertion segment 900B, a load/store segment 1000B, and a checking segment 1100B. A fixed segment 800 may be located at a suitable known location in memory and maybe outside the strand of memory 700. The same list insertion segment 900A, 900B and load/store segment 1000A, 1000B may be used by multiple different test cases. The checking segment 1100B may be optionally added along with the list insertion and load/store segments. The list insertion segment 900A, 900B and the load/store segment 1000A, 1000B and the checking segment 1100B are described further above in reference to FIGS. 9, 10, and 11. In this example, there are two list insertion segments 900A, 900B and load/store segments 1000A, 1000B and one checking segment 1100B. The execution of fixed segment 800, list insertion segments 900A and 900B, and load/store segments 1000A and 1000B mirrors that described above in reference to FIG. 12.

Referring to FIG. 14, a method 1400 shows one suitable example for an example of stress testing the list insertion in a processor memory cache using segments with non-naturally aligned data boundaries. Portions of method 1400 are preferably performed by the test case generator 123 shown in FIG. 1 and the test case executor 214 shown in FIG. 2. First, provide test code for testing a memory in a strand of non-consecutive memory segments with non-naturally aligned data boundaries (step 1410). Next, place a plurality of list insertion test segments interspersed into the test code segments (step 1420). Execute the test code with the interspersed list insertion segments and load/store segments to load data into registers using a fixed segment at known location (step 1430). Optionally, the inserted linked list is checked to ensure that the list insertion test segments 126 executed properly (step 1440). Method 1400 is then done.

FIG. 15A shows one suitable example of a method 1500 for loading and storing data into registers and memory words using a list insertion segment, a load/store segment, and a fixed segment at a known location. Method 1500 thus shows a suitable method for performing step 1430 in method 1400 in FIG. 14. FIG. 15A describes an example embodiment of a method using the list insertion and fixed segments. First, store an address in a link register of a computer processor into a general purpose register (step 1505) that corresponds to a child list element location, for example memory location 914. Branch to a fixed segment at a known location in memory and store an address of the child list element location into one of a plurality of general purpose registers (step 1510). Calculate an address to a return memory location in the list insertion segment consecutive to the list element location (step 1515), for example memory location 916. Branch to the return memory location in the list insertion segment and store the an address of a parent list element location, for example memory location 818, into a general purpose register (step 1520). The method 1500 then continues to A on FIG. 15B.

FIG. 15B continues method 1500 from FIG. 15A and describes an example embodiment of a method using the load/store segment. Load from memory a list element stored in a parent list element location (step 1525), for example memory location 818. Store the parent list element into one of a plurality of general purpose registers (step 1530). Prohibit write access to the parent list element location (step 1535). Store the parent list element into the child list element location (step 1540). Determine whether another process attempts to write to the parent list element location (step 1545). If another process has attempted to write to the parent list element location (step 1545: Yes), return to step 1525 and proceed through the method 1500 starting with that step. If no process has attempted to write to the parent list element location (step 1545: No), store the address pointing to the child list location into the parent list element location (step 1550). Method 1500 is then done. One of ordinary skill will understand that this method may be repeated multiple times. Assuming the parent list element location initially contains a value of 0, after the first iteration of method 1500, the parent list element location will contain the address of the child list element location and the child list element location will contain 0. After a second iteration in which a second child list element is introduced, the parent list element location will contain an address of a child list element location which will contain the address of the first child list element location which will contain 0.

FIG. 16 shows one suitable example of a method 1600 for checking the execution of list insertion segment 900 and load/store segment 1000. Method 1600 thus shows a suitable method for performing optional step 1440 in method 1400 in FIG. 14. Initialize a counter (step 1605), for example, by storing a high value into a general purpose register. Decrement the counter (step 1610), for example, by subtracting a value of one from the value stored in the general purpose register. Determine whether counter is at zero (step 1615). If counter is at zero (step 1615: Yes), send an interrupt to an interrupt handler (step 1620). Any suitable method of exiting the method/process may be used and one of ordinary skill may understand that any number of other mechanisms may be used to prevent an endless loop. In this example, a high value counter decremented to zero is used.

Continuing with the method of FIG. 16, if the counter is not at zero, or has not been decremented to zero, (step 1615: No), load the content at the parent memory location stored in the general purpose register at step 1520 of FIG. 15A, described above and store the content in the same general purpose register (step 1625). As an example of step 1625, refer to the example of FIG. 12: the lwz instruction loads the content at the address stored in GPR r4, which is the address of parent list element location (column 6, row X; parent list element location 818 of FIG. 8). Parent list element location contains an address of child list element location (column 3, row A; child list element location 914 of FIG. 9). Thus, the result of the lwz instruction is that the address of the child list element is inserted into GPR r4. Determine whether the content of GPR r4 is greater than zero. If the content is greater than zero (step 1630: Yes), the method 1600 loops steps 1610-1625. As the checking segment loops, the content of GPR r4 eventually reaches the first element of the list, which is the initial value of 0. When this happens, the content of GPR r4 is not greater than zero (step 1630: No), and the method 1600 is done.

The disclosure and claims herein relate to a system and method for stress testing a memory using list insertion test segments with non-naturally aligned data boundaries. List insertion test segments are interspersed into test code of a processor memory tests to insert list elements of a linked list into processor memory.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. An apparatus for testing a computer processor having a plurality of registers comprising:
   a test case generator that creates test cases with test code for testing the computer processor;
   a test case executor that replicates the test code and loads the test code into non-naturally aligned segments of consecutive memory locations on the computer processor;
   a load-store unit that loads and stores data in the memory locations and loads and stores data in the plurality of registers;
   wherein the test case executor further adds one or more list insertion test segments, wherein each list insertion test segment comprises a list insertion segment and a load/store segment, the one or more list insertion test segments interspersed in the test code in non-naturally aligned segments that insert a list element into at least one of a plurality of list element locations using a fixed segment stored at a fixed location on the computer processor.

2. The apparatus of claim 1, wherein the list insertion segment includes one or more instructions that, when executed, branch to a fixed data segment which determines a first list element location where a list element is to be inserted; and the load/store segment performs a memory read/write operation to insert the list element into the list memory location.

3. The apparatus of claim 2, wherein the first list element location is in the list insertion segment.

4. The apparatus of claim 3, wherein a second list element location is in the fixed segment.

5. The apparatus of claim 4, wherein the load/store unit includes instructions that, when executed, load a list element stored in the second list element location and stores it in the first list element location.

6. The apparatus of claim 1, wherein the fixed segment is located outside the test code at a known location in memory.

7. The apparatus of claim 1, wherein the list insertion test segment further comprises a checking segment.

8. The apparatus of claim 7, wherein the checking segment includes one or more instructions that, when executed, check each list element inserted into memory.

9. An apparatus for testing a computer processor having a plurality of registers comprising:
   a test case generator that creates test cases with test code for testing the computer processor;
   a test case executor circuit configured to replicate the test code and load the test code into non-naturally aligned segments of consecutive memory locations on the computer processor;
   a load-store circuit configured to load and store data in the memory locations and load and store data in the plurality of registers;
   wherein the test case executor circuit further adds one or more list insertion test segments, wherein each list insertion test segment comprises a list insertion segment and a load/store segment, the one or more list insertion test segments interspersed in the test code in non-naturally aligned segments that insert a list element into at least one of a plurality of list element locations using a fixed segment stored at a fixed location on the computer processor.

10. The apparatus of claim 9, wherein the list insertion segment includes one or more instructions that, when executed, branch to a fixed data segment which determines a first list element location where a list element is to be inserted; and the load/store segment performs a memory read/write operation to insert the list element into the list memory location.

11. The apparatus of claim 10, wherein the first list element location is in the list insertion segment.

12. The apparatus of claim 11, wherein a second list element location is in the fixed segment.

13. The apparatus of claim 12, wherein the load-store circuit includes instructions that, when executed, load a list element stored in the second list element location and stores it in the first list element location.

14. The apparatus of claim 9, wherein the fixed segment is located outside the test code at a known location in memory.

15. The apparatus of claim 9, wherein the list insertion test segment further comprises a checking segment.

16. The apparatus of claim 15, wherein the checking segment includes one or more instructions that, when executed, check each list element inserted into memory.

* * * * *